US006947717B2

(12) United States Patent
Daxion

(10) Patent No.: US 6,947,717 B2
(45) Date of Patent: Sep. 20, 2005

(54) HIGH ISOLATION MIXER

(76) Inventor: Ji Daxion, 1968 E. 26 St., Brooklyn, NY (US) 11229

( * ) Notice: Subject to any disclaimer, the term of this patent is extended or adjusted under 35 U.S.C. 154(b) by 481 days.

(21) Appl. No.: 10/265,424

(22) Filed: Oct. 7, 2002

(65) Prior Publication Data

US 2003/0228859 A1 Dec. 11, 2003

Related U.S. Application Data

(60) Provisional application No. 60/386,684, filed on Jun. 7, 2002.

(51) Int. Cl.[7] .............................. H04B 1/18; H04B 1/26

(52) U.S. Cl. ....................................... 455/292; 455/330

(58) Field of Search .................................. 455/330, 292, 455/313, 318, 319, 323, 325, 326; 327/113

(56) References Cited

U.S. PATENT DOCUMENTS

| | | | | |
|---|---|---|---|---|
| 4,375,700 A | * | 3/1983 | Hallford | 455/330 |
| 5,280,647 A | * | 1/1994 | Arai et al. | 455/326 |
| 5,731,740 A | * | 3/1998 | van de Westerlo | 330/276 |
| 6,653,910 B2 | * | 11/2003 | Escalera et al. | 333/26 |

* cited by examiner

Primary Examiner—Nguyen T. Vo
(74) Attorney, Agent, or Firm—Kevin Redmond

(57) ABSTRACT

A mixer with improved isolation between the RF and local oscillator frequency signals. The mixer has a substrate. A pair of cores are mounted to the substrate. Windings are wound on the cores to from a pair of baluns. A diode ring is connected between the baluns. The windings are formed from a first and second twisted pair of wires on one core and a third and fourth twisted pair of wires on another core. Some of the wires are wound on the cores but not twisted together. This winding configuration achieves superior balance between the baluns and good isolation.

20 Claims, 10 Drawing Sheets

HIGH ISOLATION MIXER

This application claims the benefit of Provisional Application Ser. No. 60/386,684, filed Jun. 7, 2002.

BACKGROUND

1. Field of the Invention

This invention relates to mixers in general and more particularly to a mixer that has high local oscillator to RF (L-R) isolation, low conversion loss and good VSWR at a low cost.

2. Description of Related Art

A mixer circuit converts a radio frequency (RF) signal to an intermediate frequency (IF) signal which is the difference of the RF and a local oscillator (LO) signal. The IF frequency is obtained by multiplying the RF signal with the local oscillator (LO) signal. The difference or IF frequency is a result of the non-linearity of the mixer. Along with the IF frequency, the mixer typically generates inter-modulation products due to the non-linearity response.

FIG. 1 shows a schematic drawing of a prior art mixer. Mixer 20 has a local oscillator input terminal LO for receiving a local oscillator signal, an RF input terminal RF for receiving an RF signal and an intermediate frequency output terminal IF for providing an intermediate frequency output signal.

A diode ring QD1 has four diodes D1, D2, D3, and D4. The diodes are connected in a ring configuration. The cathode of each diode is connected to the anode of the adjacent diode. Node 22 is connected between diodes D1 and D2. Node 23 is connected between diodes D2 and D3. Node 24 is connected between diodes D3 and D4. Node 25 is connected between diodes D1 and D4.

Mixer 20 has a local oscillator port LO that is connected to local oscillator balun transformer T1. Transformer T1 has windings T1$a$ and T1$b$ that are wound on a core C1. Windings T1$a$ and T1$b$ are magnetically coupled. Winding T1$a$ has one end connected to port LO and the other end connected to ground G. Winding T1$b$ has one end connected to node 22 and the other end connected to node 24. The midpoint of winding T1$b$ is connected to ground. Transformer T2 has windings T2$a$ and T2$b$ that are wound on a core C2. Windings T2$a$ and T2$b$ are magnetically coupled. Winding T2$a$ has one end connected to port RF and the other end connected to ground G. Winding T2$b$ has one end connected to node 23 and the other end connected to node 25. The midpoint of winding T2$b$ is connected to port IF.

The turns ratio of balun transformers T1 and T2 determine the VSWR at the local oscillator (LO) and RF terminals. The amplitude unbalance and phase unbalance of balun transformers T1 and T2 determine the L-R isolation. The insertion loss and matching of diode ring QD1 to balun transformers T1 and T2 determines the conversion loss of the mixer. Due to parasitic capacitance between the primary and secondary windings, the amplitude unbalance of balun transformers T1 and T2 becomes worse at high frequency. The VSWR and insertion loss of balun transformers T1 and T2 becomes worse at high frequency.

While various mixers have been used, they have suffered from not having high local oscillator to RF (L-R) isolation, low conversion loss and good VSWR at a low cost.

A current unmet need exists for a mixer that has high L-R isolation, low conversion loss, good VSWR and that can be assembled at low cost.

SUMMARY

It is a feature of the invention to provide a mixer for mixing an RF input signal with a local oscillator signal to provide at an output an intermediate frequency signal that is easily assembled at low cost.

Another feature of the invention to provide a mixer that has improved isolation between the RF signal and the local oscillator signal.

Another feature of the invention to provide a mixer that has improved VSWR and conversion loss.

Another feature of the invention is to provide a mixer that mixes an RF input signal with a local oscillator signal to provide an intermediate frequency signal. The mixer includes a first balun transformer that has a first winding, a second winding and a third winding. The first winding is coupled to the second and third windings. The first winding is connected between a local oscillator terminal and ground. The second winding is connected between ground and a first node. The third winding is connected between ground and a second node. A second balun transformer has a fourth winding, a fifth winding and a sixth winding. The fourth winding is coupled to the fifth and sixth windings. The fourth winding is connected between an RF terminal and ground. The fifth winding is connected between an intermediate frequency terminal and a third node. The sixth winding is connected between the intermediate frequency terminal and a fourth node. The mixer has four diodes. One diode is connected between each of the first, second, third and fourth nodes.

BRIEF DESCRIPTION OF THE DRAWINGS

It is noted that the drawings of the invention are not to scale. In the drawings, like numbering represents like elements between the drawings.

DETAILED DESCRIPTION

Figure 1:
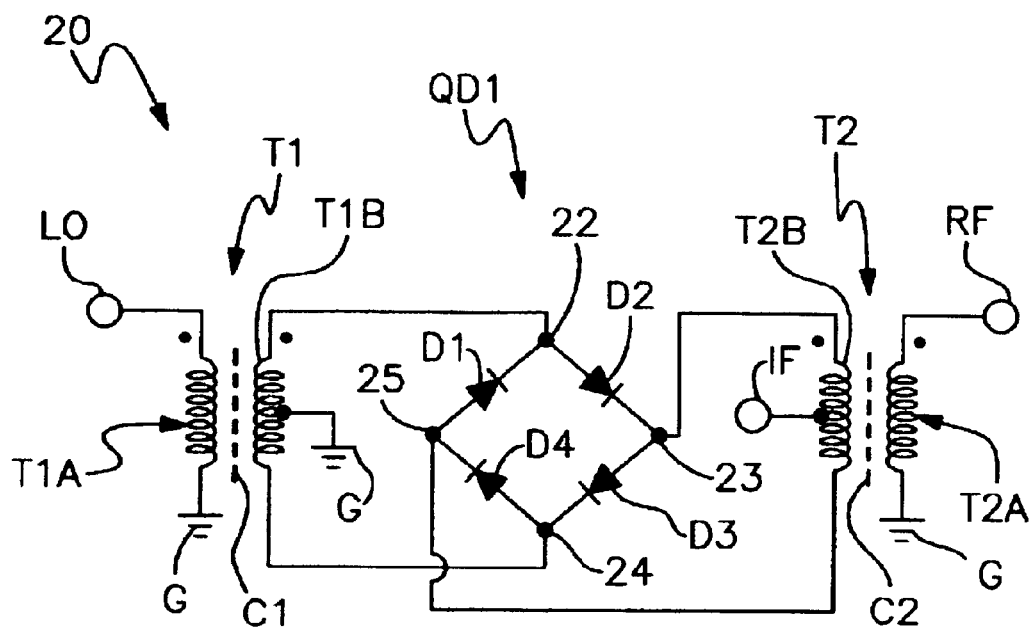
FIG. 1 is a schematic drawing of a prior art double balanced mixer.
Figure 2:
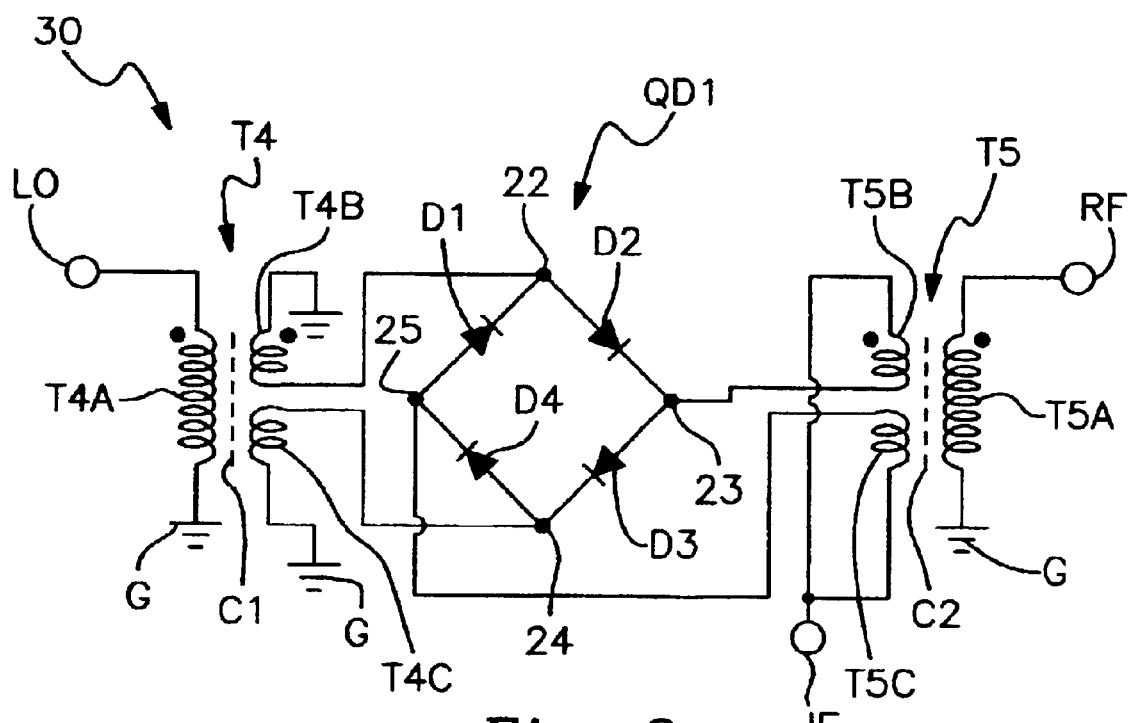
FIG. 2 is a schematic drawing of a double balanced mixer in accordance with the present invention.

Referring to FIG. 2, a schematic drawing of double balanced mixer 30 in accordance with the present invention is shown. Mixer 30 has a local oscillator port LO that is connected to local oscillator balun transformer T4. Transformer T4 has windings T4*a*, T4*b* and T4*c* that are wound on a core C1. Winding T4*a* is a primary winding. Windings T4*b* and T4*c* are secondary windings. Windings T4*a* and T4*b* are magnetically coupled as are windings T4*a* and T4*c*. Winding T4*a* has one end connected to port LO and the other end connected to ground G. Winding T4*b* has one end connected to node 22 and the other end connected to ground G. Winding T4*c* has one end connected to node 24 and the other end connected to ground G. A set of four diodes or diode quad QD1 is arranged in a ring configuration. Diode quad QD1 has four diodes D1, D2, D3 and D4. The diodes are arranged such that the cathode of one diode is connected to the anode of another diode. Diode quad QD1 has nodes 23, 23, 24 and 25. Transformer T5 has windings T5*a*, T5*b* and T5*c* that are wound on a core C2. Winding T5*a* is a primary winding. Windings T5*b* and T5*c* are secondary windings T5*a* and T5*b* are magnetically coupled as are windings T5*a* and T5*c*. Winding T5*a* has one end connected to port RF and the other end connected to ground G. Winding T5*b* has one end connected to node 23 and the other end connected to port IF. Winding T5*c* has one end connected to node 25 and the other end connected to port IF.

Figure 3:
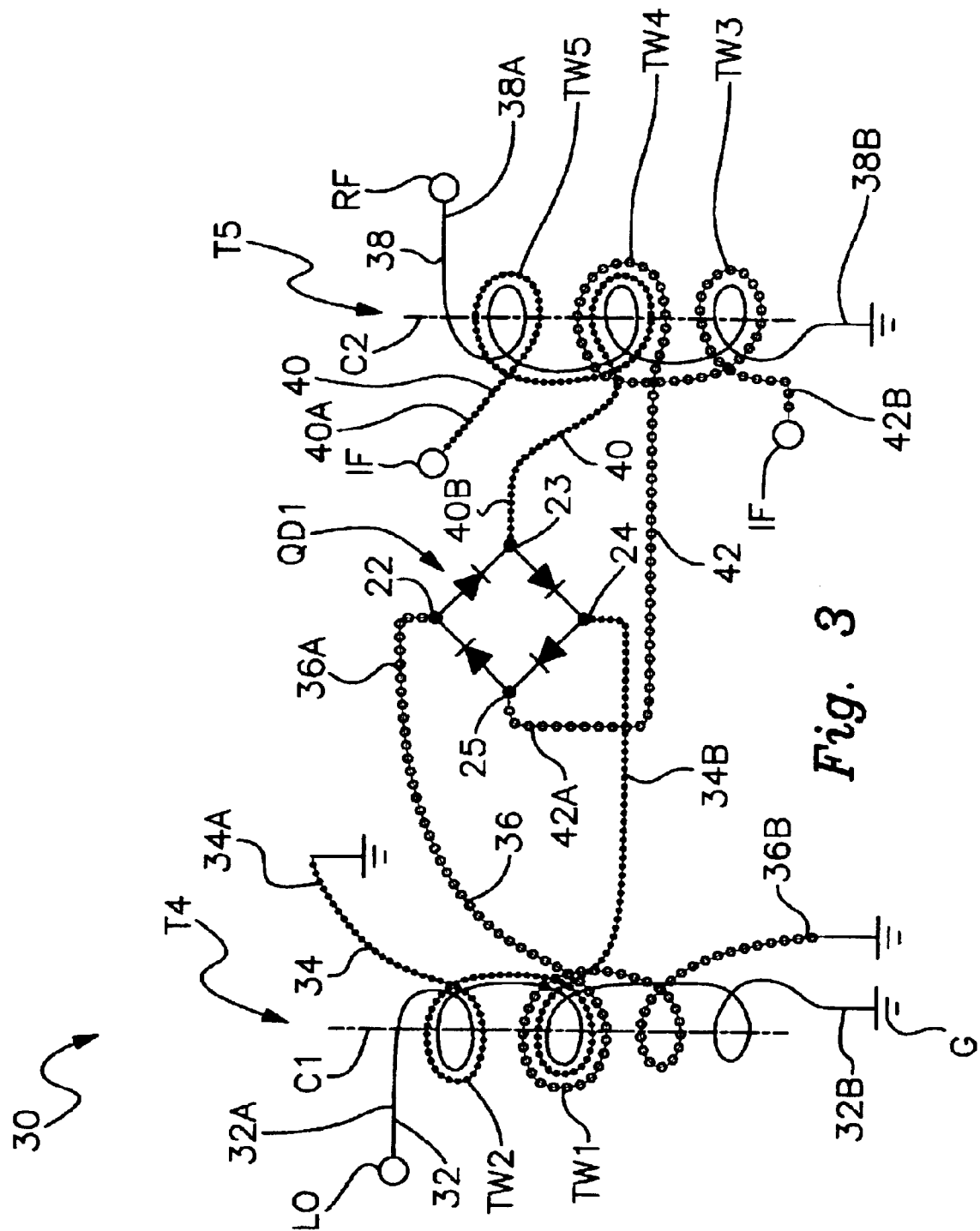
FIG. 3 is a diagrammatic view of the layout of the windings of FIG. 2.

Turning to FIG. 3, a layout diagram of the windings of balun transformers T4 and T5 are shown. Wires 32, 34 and 36 are wound on core C1 to form LO balun transformer T4. Wire 32 has 3.5 turns, wire 34 has 2.5 turns and wire 36 has 2.5 turns. Wire 32 has ends 32A and 32B. Wire 34 has ends 34A and 34B. Wire 36 has ends 36A and 36B. Wires 32 and 34 are twisted together to form a pair of twisted wires TW1 for 2 turns. Wires 32, 34 and 36 are twisted together to form twisted wires TW2 for 1 turn. Winding T4*a* corresponds to wire 32. Winding T4*b* corresponds to wire 34. Winding T4*c* corresponds to wire 36. This design of transformer T4 provides a differential LO signal to diode ring QD1 that has better amplitude unbalance.

Wires 38, 40 and 42 are wound on core C2 to form balun transformer T5. Wire 38 has 3.5 turns, wire 40 has 2.5 turns and wire 42 has 2.5 turns. Wire 38 has ends 38A and 38B. Wire 40 has ends 40A and 40B. Wire 42 has ends 42A and 42B. Wires 38 and 40 are twisted together to form twisted wires TW5 for 1 turn. Wires 38, 40 and 42 are twisted together to form twisted wires TW4 for 1 turn. Wires 38 and 42 are twisted together to form twisted wires TW3 for 1 turn. Winding T5*a* corresponds to wire 38. Winding T5*b* corresponds to wire 40. Winding T5*c* corresponds to wire 42.

Figure 4:
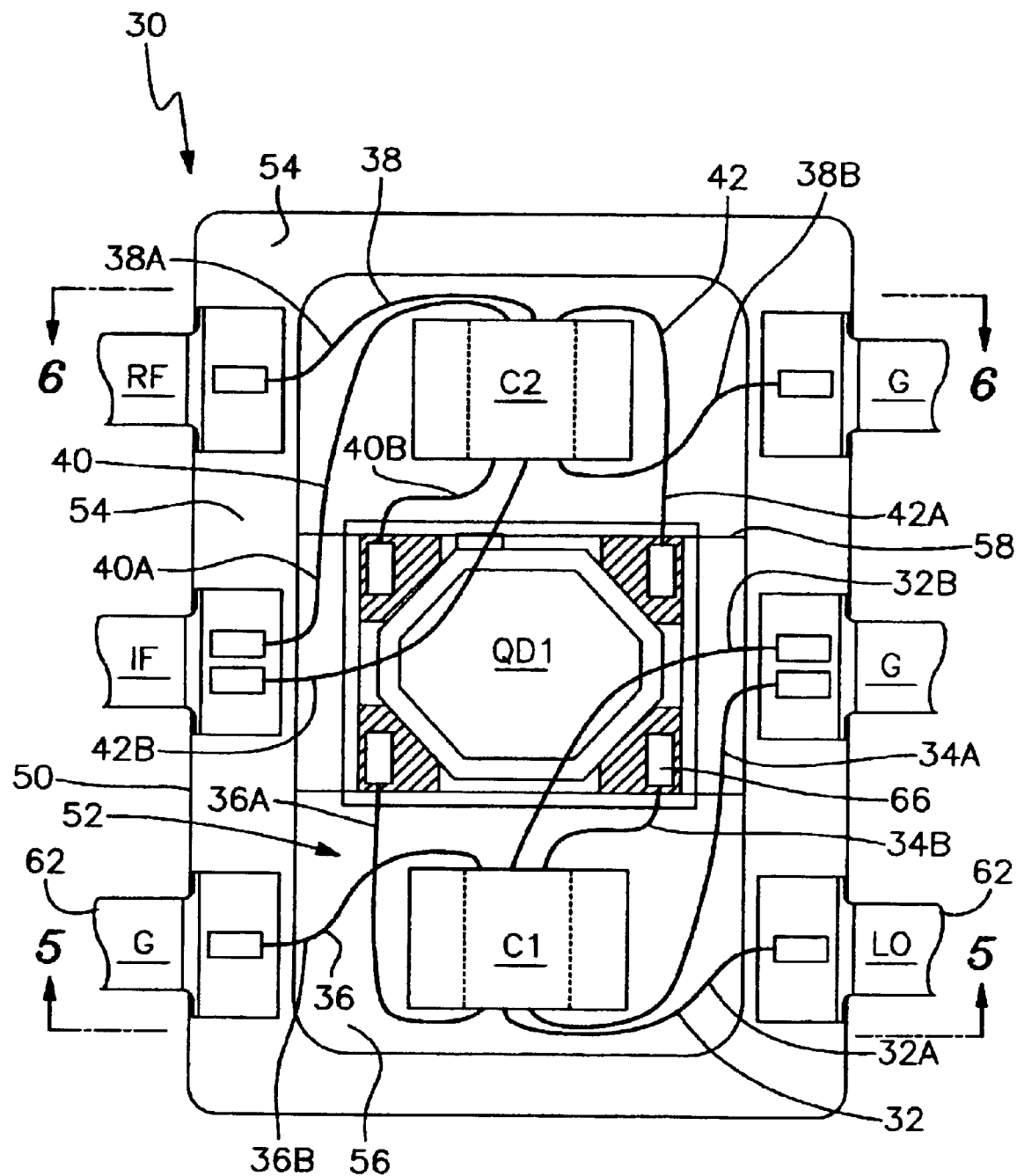
FIG. 4 is a top view of a physical package layout of the mixer of FIG. 2.
Figure 5:
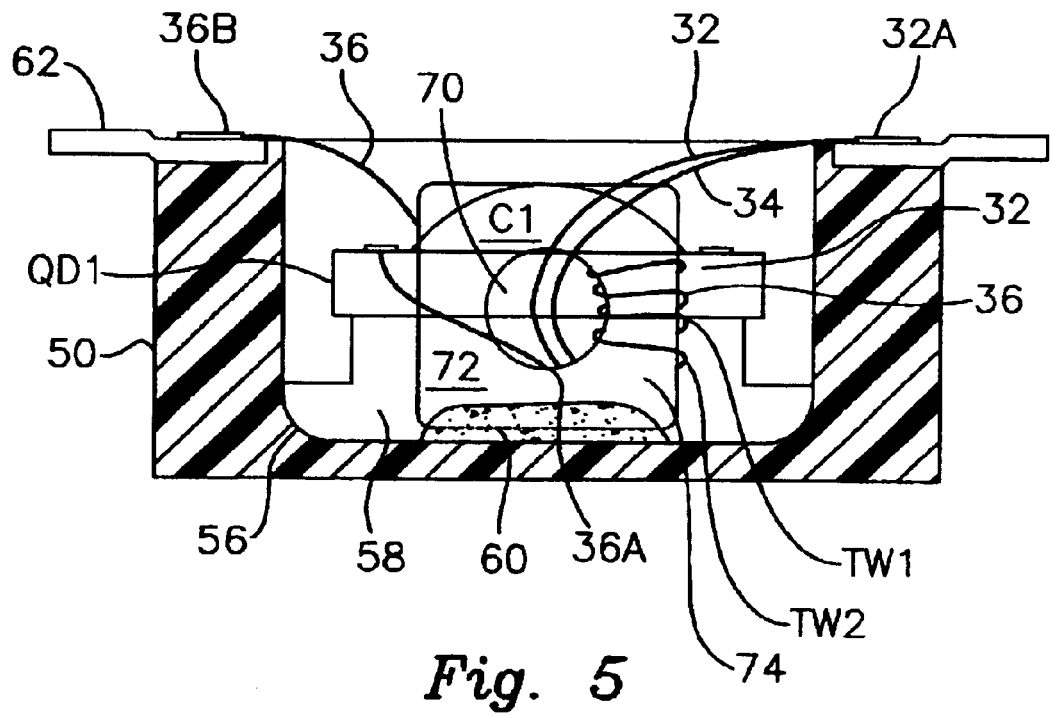
FIG. 5 is a left side cross-sectional view of FIG. 4.
Figure 6:
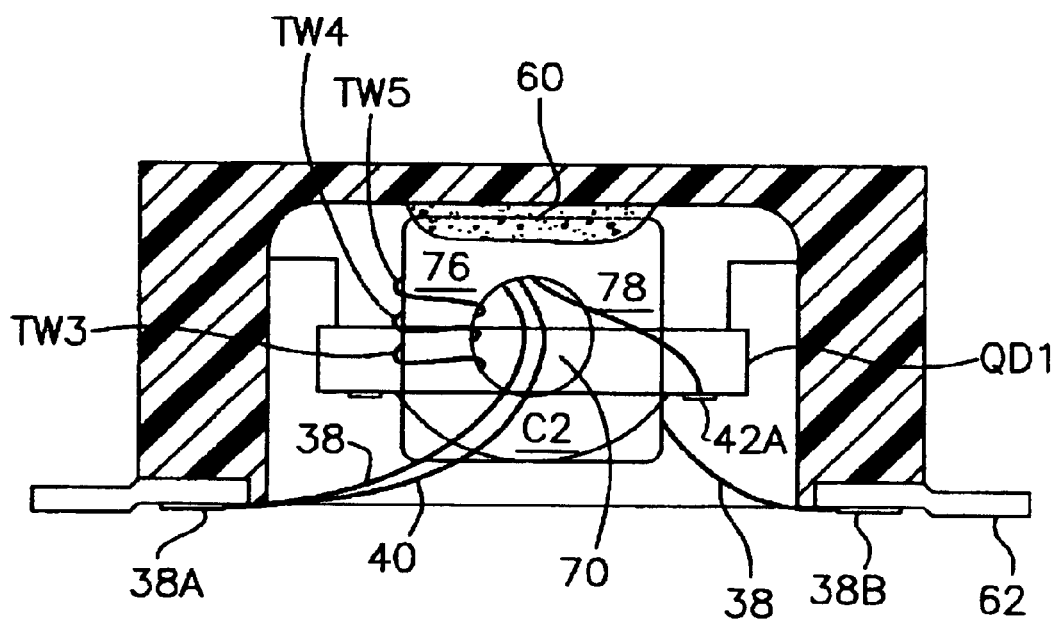
FIG. 6 is a right side cross-sectional view of FIG. 4.

Referring now to FIGS. 4–6, mixer 30 is realized in a physical package. Mixer 30 has a carrier 50. Carrier 50 has a cavity 52, rim 54, bottom surface 56 and support 58. Metal leads 62 are attached to rim 54. Leads 62 would be soldered to an external printed circuit board (not shown). Diode ring QD1 is assembled as a chip on board on a ceramic substrate and is attached to support 58 by an epoxy (not shown). Wires 34B, 36A, 40B and 42A are connected to pads 66 on diode QD1.

Ferrite cores C1 and C2 are attached to surface 56 with an epoxy 60. Cores C1 and C2 each have apertures 70 through which the windings pass. Core C1 has legs 72 and 74. Core C2 has legs 76 and 78.

Balun transformer T4 has core C1 with legs 72 and 74. Wires 32, 34 and 36 are wound on leg 74. Twisted wires TW1 and TW2 are wound on leg 74. The wire ends 32A, 34A, 32B and 36B are welded or soldered to leads 62. Balun transformer T5 has core C2 with legs 76 and 78. Twisted wires TW3, TW4 and TW5 are wound on leg 74. The wire ends 38A, 38B, 40A and 42B are welded or soldered to leads 62.

The present invention has several advantages. The mixer has very good L-R isolation over a broad frequency range. The improved isolation is due to configuring the windings of the transformers to achieve superior balance. The turns ratio of transformers T4 and T5 were selected to match the impedance presented by diode ring QD1. This results in a mixer with low conversion loss, low conversion loss flatness, excellent LO, RF and IF port matching and superior L-R isolation.

A mixer 30 was fabricated and tested for electrical performance as was the prior art mixer 20. The results are shown graphically in the following figures.

Figure 7:
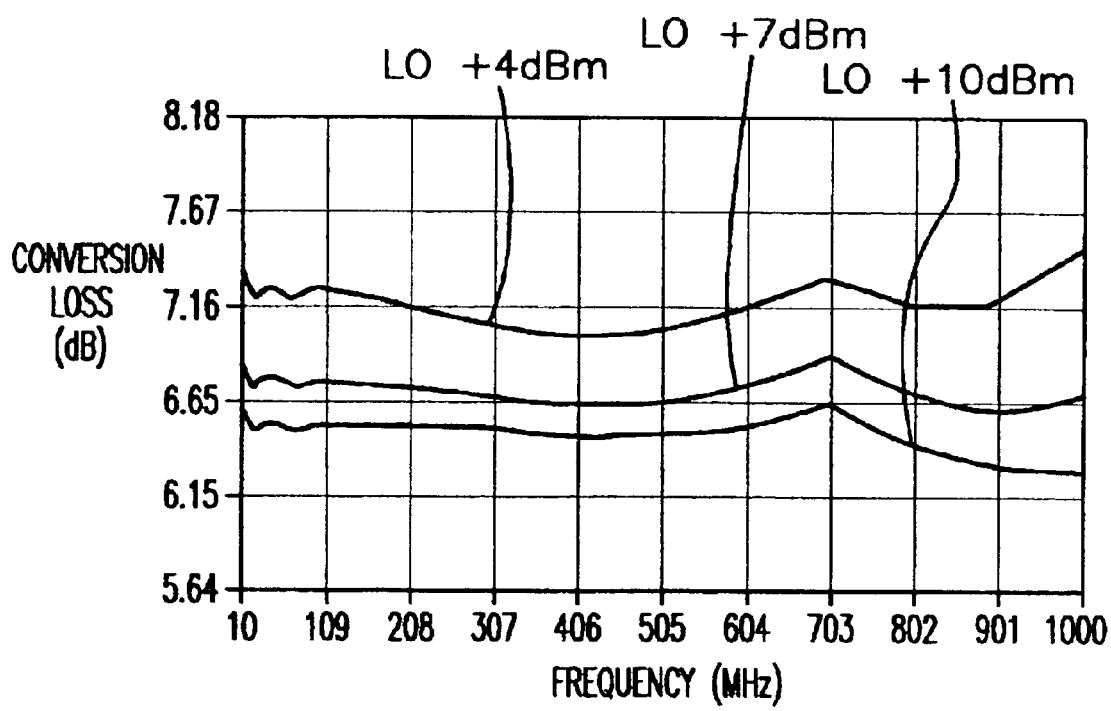
FIG. 7 is a graph of conversion loss versus RF frequency for the mixer of FIG. 2.

FIG. 7 is a graph of conversion loss versus RF frequency for mixer 30. The conversion loss is very flat. It is within +/−0.2 dB over the frequency range of 10 to 1000 MHz. This is a vast improvement over prior art mixers.

Figure 7A:
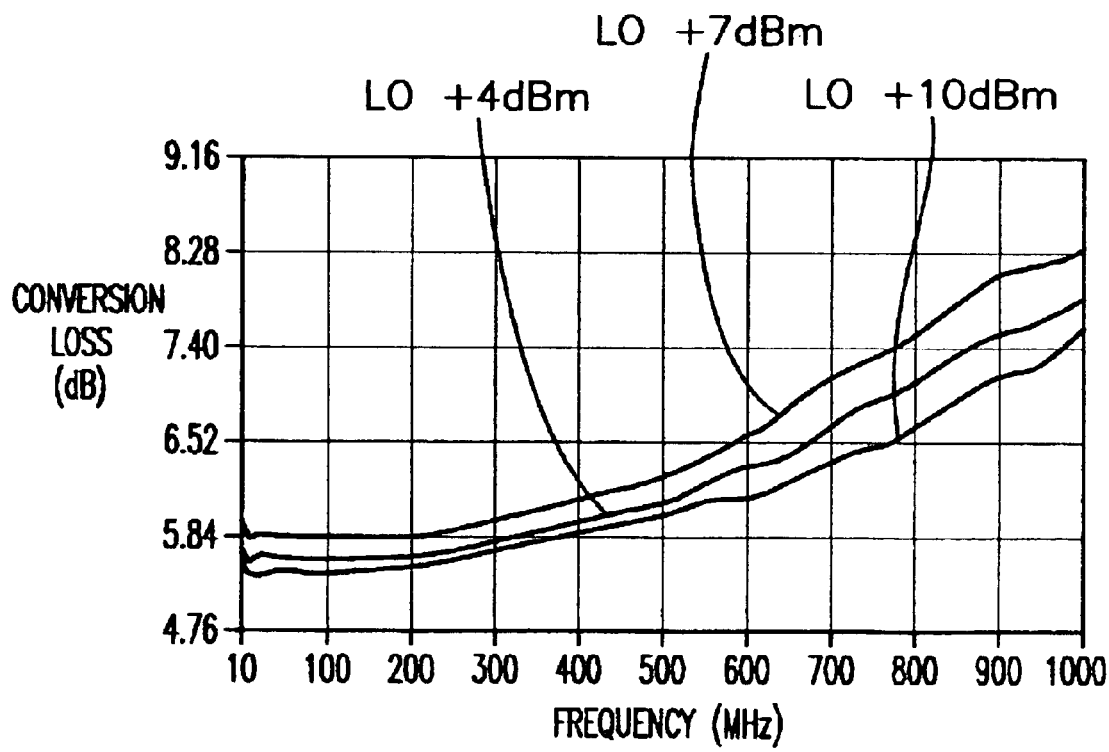
FIG. 7A is a graph of conversion loss versus RF frequency for a prior art mixer.

FIG. 7A is a graph of conversion loss versus RF frequency for prior art mixer 20. The conversion loss is +/−1.6 dB over the frequency range. Therefore, the conversion loss of the present mixer 30 is much better than that of prior art mixer 20.

Figure 8:
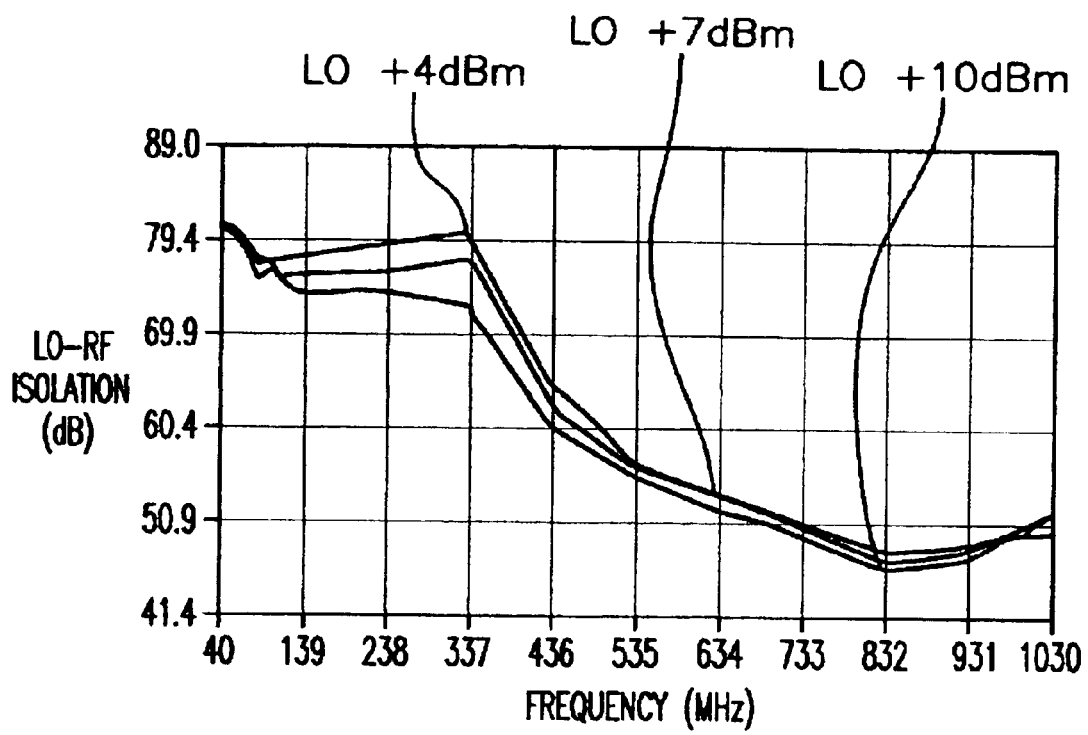
FIG. 8 is a graph of L-R isolation versus frequency for the mixer of FIG. 2.

FIG. 8 is a graph of L-R isolation versus frequency for the mixer of FIG. 2. The isolation starts at 80 dB at 10 MHz, drops to 75 dB at 60 MHz, stays at 75 dB until 300 MHz, drops to 60 dB at 410 MHz and then levels off at 48 dB. This is a 15 to 30 dB improvement over the L-R isolation of the prior art mixer seen in FIG. 8A.

Figure 8A:
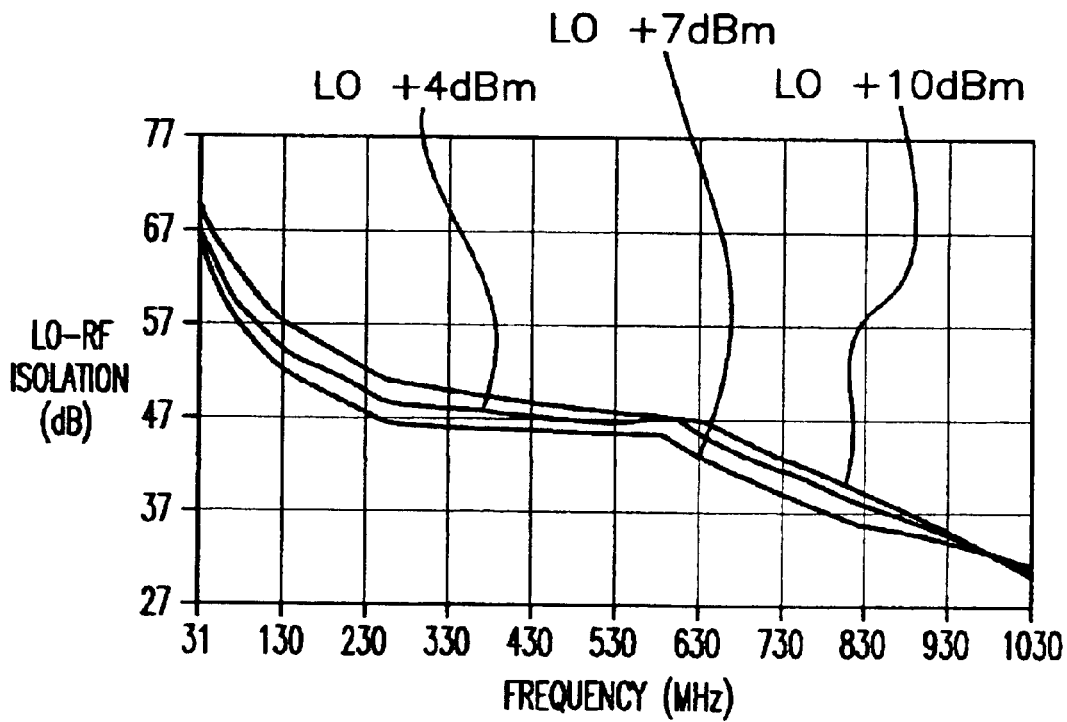
FIG. 8A is a graph of L-R isolation versus frequency for a prior art mixer.

FIG. 8A is a graph of L-R isolation versus frequency for a prior art mixer.

Figure 9:
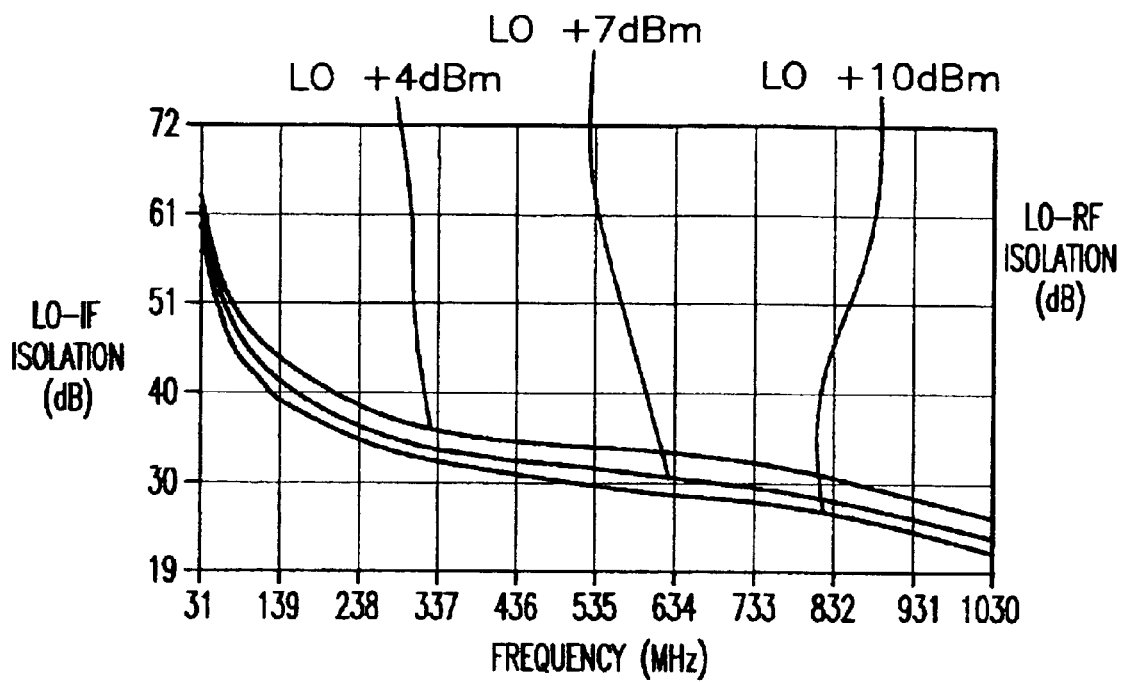
FIG. 9 is a graph of L-I isolation versus frequency for the mixer of FIG. 2.

FIG. 9 is a graph of L-I isolation versus frequency for the mixer of FIG. 2.

Figure 9A:
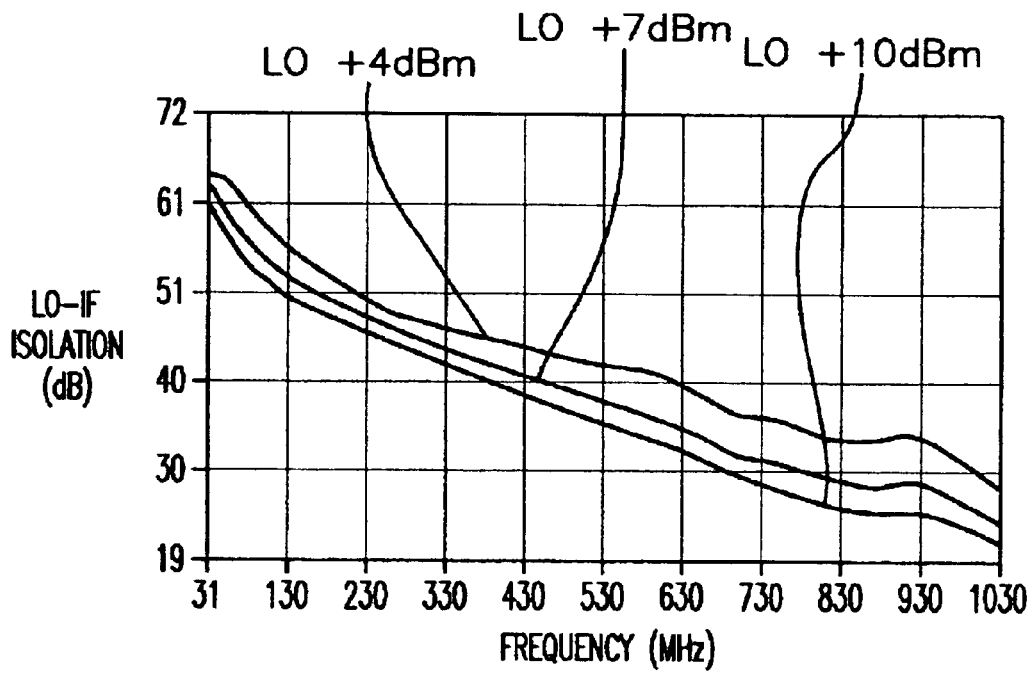
FIG. 9A is a graph of L-I isolation versus frequency for a prior art mixer.

FIG. 9A is a graph of L-I isolation versus frequency for a prior art mixer. The L-I isolation is similar for the new mixer 30 and the prior art mixer.

Figure 10:
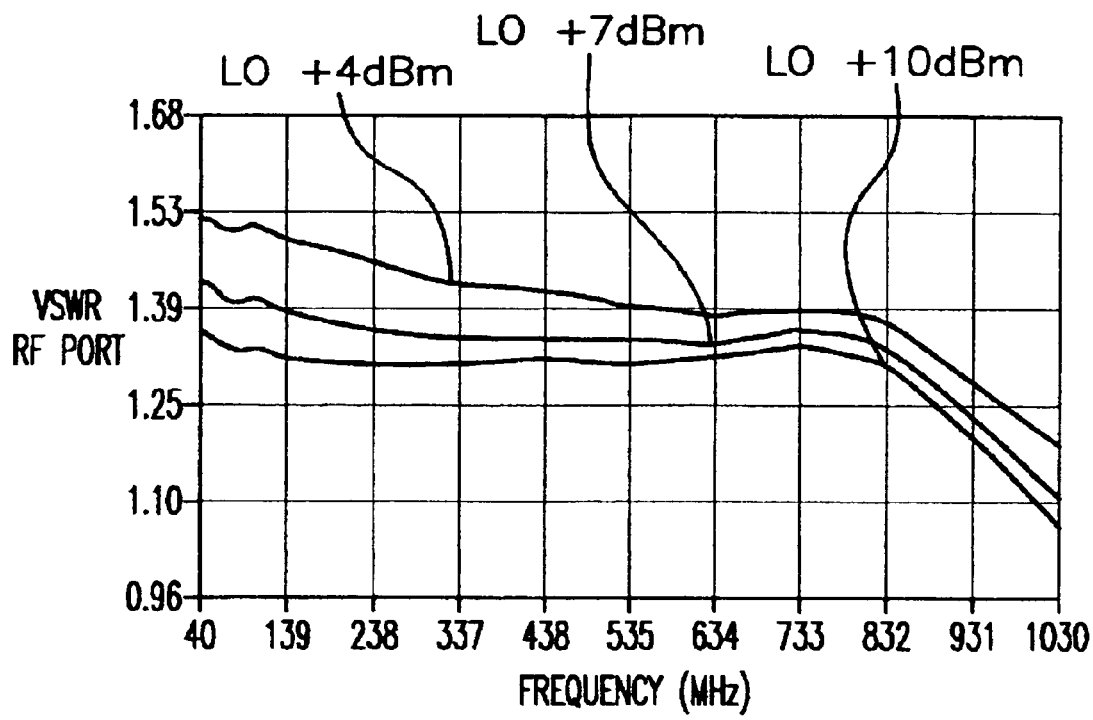
FIG. 10 is a graph of VSWR at the RF terminal for the mixer of FIG. 2.

FIG. 10 is a graph of VSWR at the RF terminal for the mixer of FIG. 2.

Figure 10A:
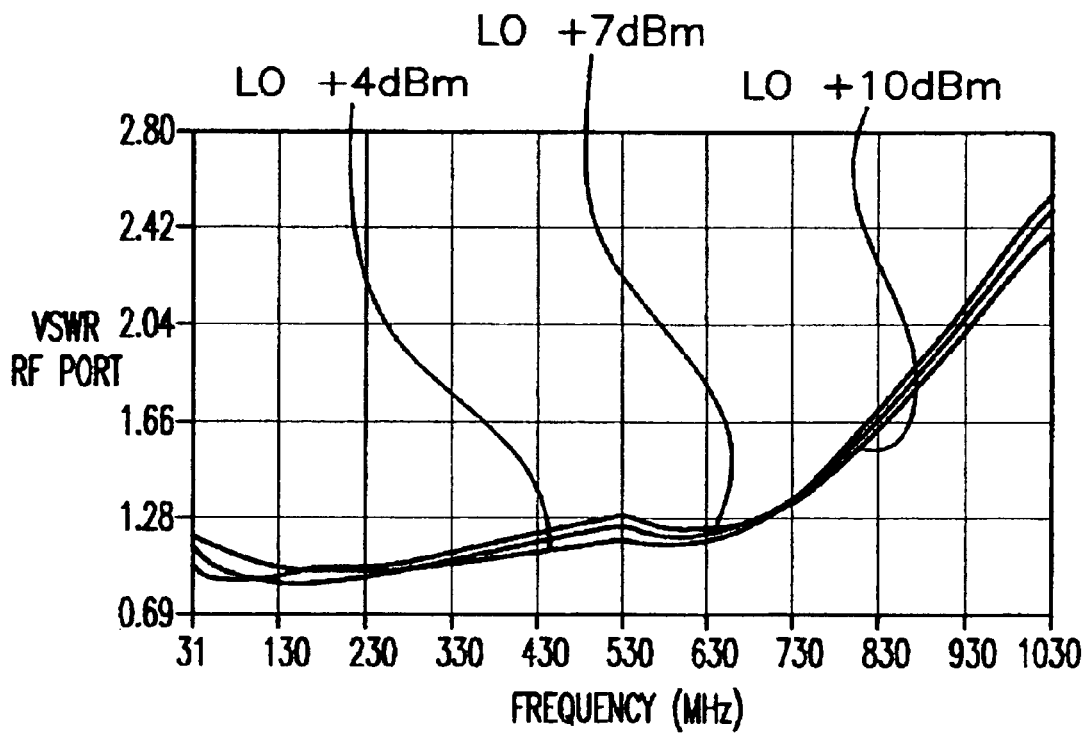
FIG. 10A is a graph of VSWR at the RF terminal for a prior art mixer.

FIG. 10A is a graph of VSWR at the RF terminal for a prior art mixer. The RF port match of mixer 30 (1.1:1 to 1.5:1) is improved over the prior art mixer (1.4:1 to 2.5:1).

Figure 11:
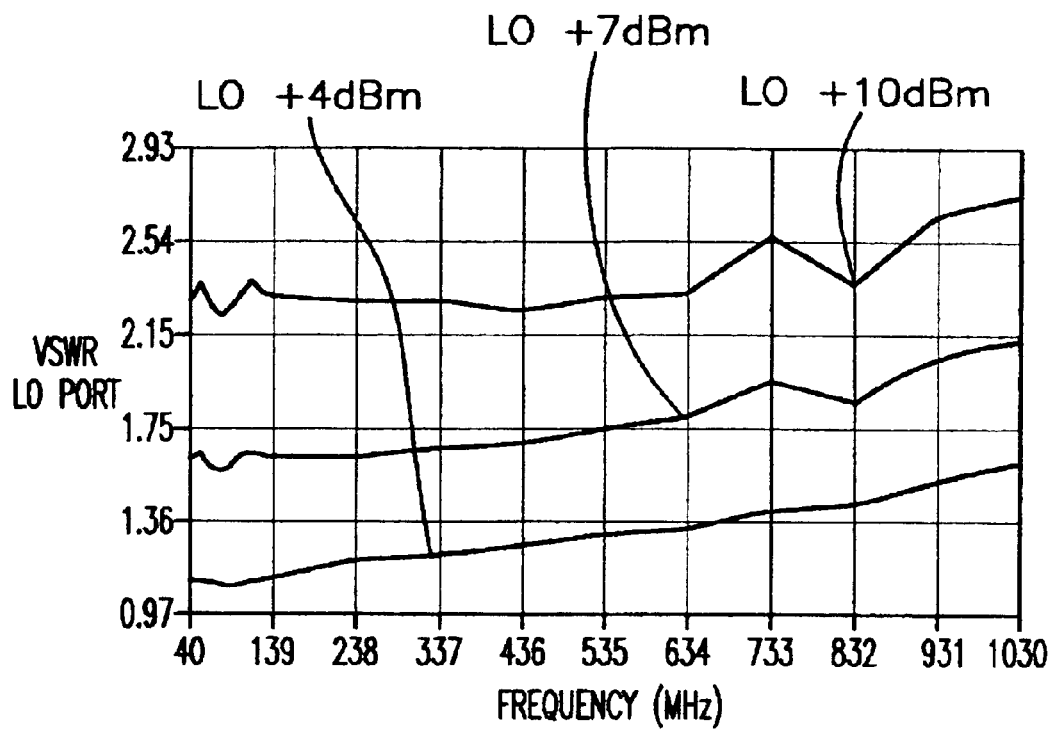
FIG. 11 is a graph of VSWR at the LO terminal for the mixer of FIG. 2.

FIG. 11 is a graph of VSWR at the LO terminal for the mixer of FIG. 2.

Figure 11A:
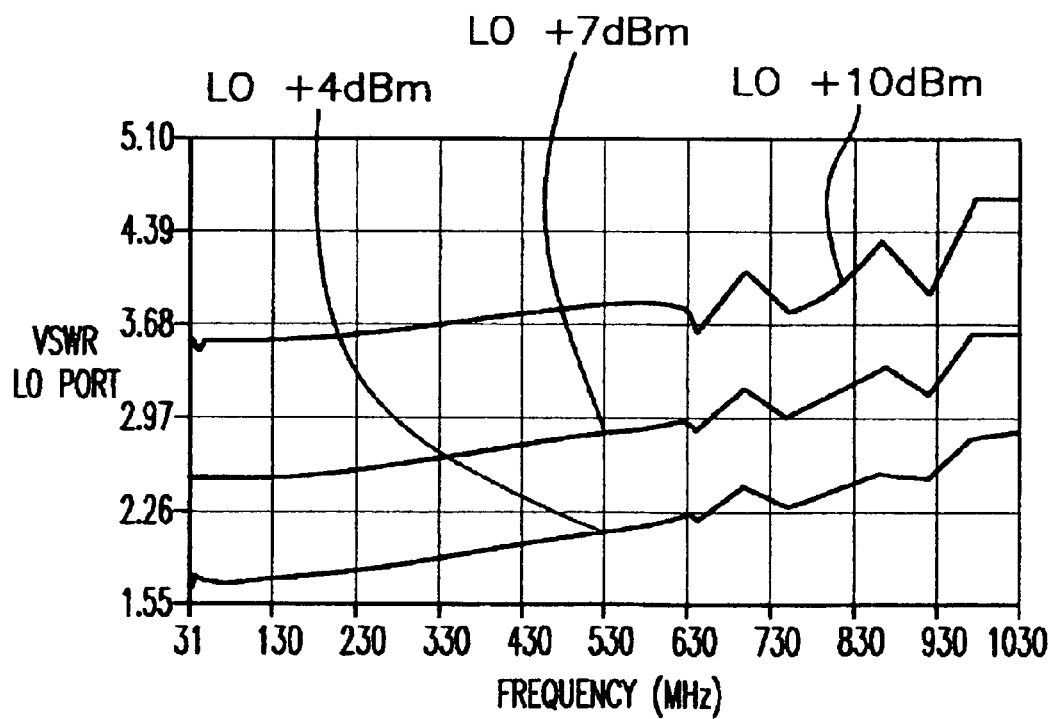
FIG. 11A is a graph of VSWR at the LO terminal for a prior art mixer.

FIG. 11A is a graph of VSWR at the LO terminal for a prior art mixer. The LO port match of mixer 30 (1.5:1 to 2.0:1) is improved over the prior art mixer (2.5:1 to 3.7:1) for 7 dBm LO power level. The performance is substantially improved at 4 and 10 dBm LO power levels.

Figure 12:
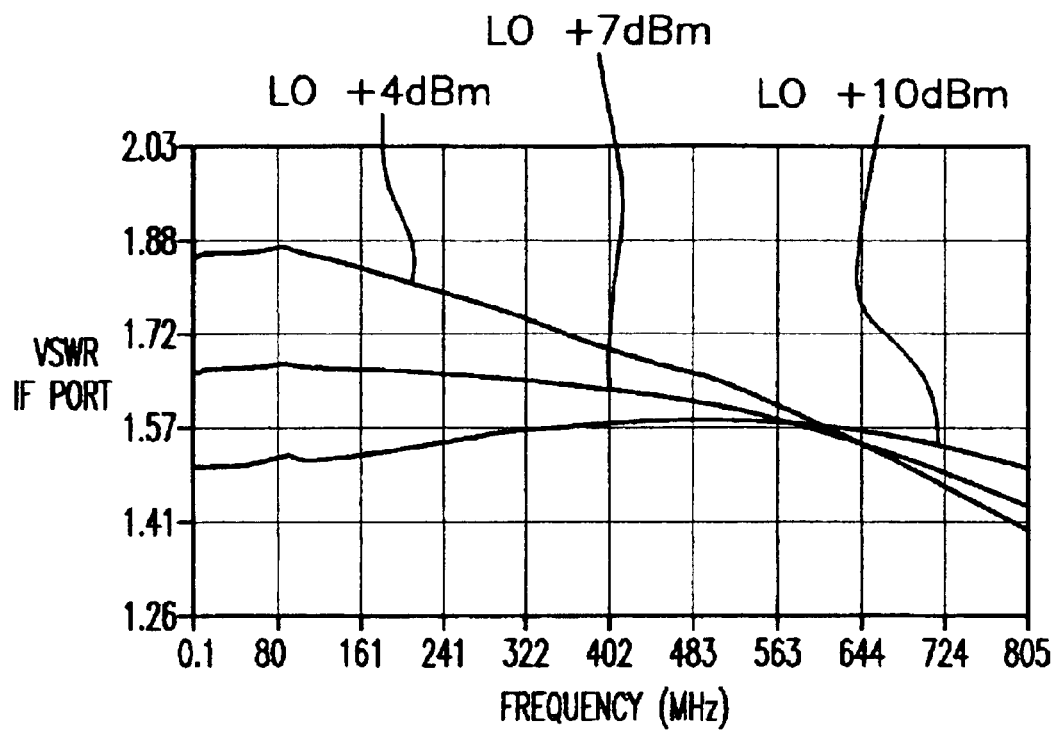
FIG. 12 is a graph of VSWR at the IF terminal for the mixer of FIG. 2.

FIG. 12 is a graph of VSWR at the IF terminal for the mixer of FIG. 2.

Figure 12A:
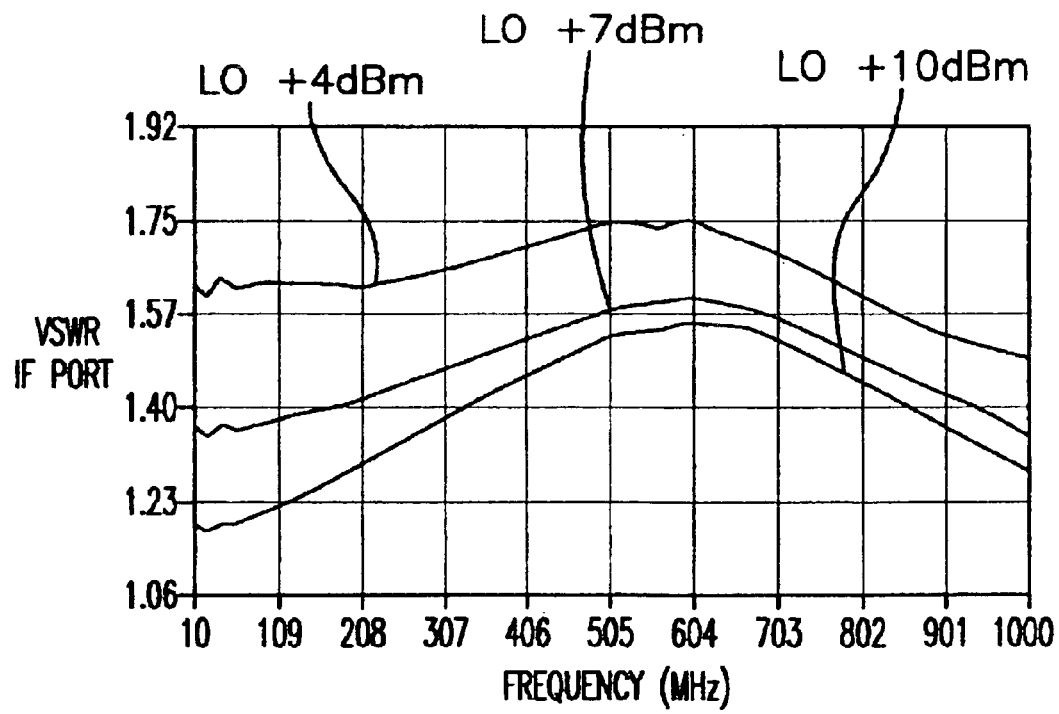
FIG. 12A is a graph of VSWR at the IF terminal for a prior art mixer.

FIG. 12A is a graph of VSWR at the IF terminal for a prior art mixer. The IF port match of mixer 30 is about the same as the prior art mixer.

High isolation mixer 30 has high L-R isolation, low conversion loss, good VSWR and can be assembled at low cost providing an improvement over previous mixers.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A mixer for mixing an RF input signal with a local oscillator signal to provide an intermediate frequency signal, comprising:
    a) a first balun transformer having a first winding, a second winding and a third winding, the first winding coupled to the second and third windings, the first winding connected between a local oscillator terminal and ground, the second winding connected between ground and a first node, the third winding connected between ground and a second node, the first balun transformer further having a first core and a first, a second and a third wire, the first wire and the second wire twisted together and partially wound on the first core, the first wire and the third wire twisted together and partially wound on the first core;
    b) a second balun transformer having a fourth winding, a fifth winding and a sixth winding, the fourth winding coupled to the fifth and sixth windings, the fourth winding connected between an RF terminal and ground, the fifth winding connected between an intermediate frequency terminal and a third node, the sixth winding connected between the intermediate frequency terminal and a fourth node; and
    c) four diodes, one diode being connected between each of the first, second, third and fourth nodes.

2. The mixer according to claim 1, wherein a cathode of each diode is series connected to an anode of another diode.

3. The mixer according to claim 2, wherein the diodes are located in a semiconductor die.

4. The mixer according to claim 3, wherein the semiconductor die is mounted to a substrate.

5. The mixer according to claim 1, wherein the second balun transformer further comprises:
    a) a second core;
    b) a fourth, a fifth and a sixth wire;
    c) the fourth wire and the fifth wire twisted together and partially wound on the second core; and
    d) the fourth wire and the sixth wire twisted together and partially wound on the second core.

6. The mixer according to claim 5, wherein the second core is mounted to a substrate.

7. The mixer according to claim 5, wherein the fourth, fifth and sixth wires have at least two turns wound on the core.

8. The mixer according to claim 1, wherein the first core is mounted to a substrate.

9. The mixer according to claim 1, wherein the first, second and third wires have at least two turns wound on the core.

10. A mixer comprising:
    a) a substrate;
    b) a first and second balun transformer mounted to the substrate, the first transformer having a first core and the second transformer having a second core;
    c) a first twisted pair of wires wound on the first core, the first twisted pair of wires having a first and second wire;
    d) a second twisted pair of wires wound on the first core, the second twisted pair of wires having the first wire and a third wire;
    e) a third twisted pair of wires wound on the second core, the third twisted pair of wires having a fourth and fifth wire;
    f) a fourth twisted pair of wires wound on the second core, the fourth twisted pair of wires having the fourth wire and a sixth wire; and
    g) a plurality of diodes mounted to the substrate in a ring configuration, the diodes electrically connected to the balun transformers.

11. The mixer according to claim 10, wherein the first wire is connected between a local oscillator terminal and ground.

12. The mixer according to claim 10, wherein the second wire is connected between ground and two of the diodes.

13. The mixer according to claim 10, wherein the third wire is connected between ground and two of the diodes.

14. The mixer according to claim 10, wherein the fourth wire is connected between an RF terminal and ground.

15. The mixer according to claim 10, wherein the fifth wire is connected between an intermediate frequency terminal and two of the diodes.

16. The mixer according to claim 10, wherein the sixth wire is connected between the intermediate frequency terminal and two of the diodes.

17. The mixer according to claim 10, wherein there are four diodes and a cathode of each diode is series connected to an anode of another diode.

18. A mixer comprising:
    a) a local oscillator balun transformer having a local oscillator terminal for receiving a local oscillator signal;
    b) a second balun transformer having an intermediate frequency terminal for providing an intermediate frequency signal and an RF terminal for receiving an RF signal;
    c) a diode ring connected between the local oscillator balun and the second balun, the diodes mixing the local oscillator signal with the RE signal to provide the intermediate frequency signal, the diode ring having a first node, a second node, a third node and a fourth node;
    d) the local oscillator balun transformer having a first winding, a second winding and a third winding, the first winding connected between the local oscillator terminal and ground, the second winding connected between ground and the first node, the third winding connected between ground and the second node, the local oscillator balun transformer having a first core, the first, second and third windings wound on the first core wherein, a portion of the first winding and the second winding are twisted together on the first core and a portion of the first winding and the third winding are twisted together on the first core; and
    e) the second balun transformer having a fourth winding, a fifth winding and a sixth winding, the fourth winding connected between the RF terminal and ground, the fifth winding connected between the intermediate frequency terminal and the third node, the sixth winding connected between the intermediate frequency terminal and the fourth node, the second balun transformer having a second core, the fourth, fifth and sixth windings wound on the second core wherein, a portion of the fourth winding and the fifth winding are twisted together on the second core and a portion of the fourth winding and the sixth winding are twisted together on the second core.

19. The mixer according to claim 18, wherein the first winding is a primary winding and the second and third windings are secondary windings, the first winding electromagnetically coupled to the second and third windings.

20. The mixer according to claim 19, wherein the fourth winding is a primary winding and the fifth and sixth windings are secondary windings, the fourth winding electromagnetically coupled to the fifth and sixth windings.

* * * * *

UNITED STATES PATENT AND TRADEMARK OFFICE
CERTIFICATE OF CORRECTION

| | | |
|---|---|---|
| PATENT NO. | : 6,947,717 B2 | Page 1 of 1 |
| APPLICATION NO. | : 10/265424 | |
| DATED | : September 20, 2005 | |
| INVENTOR(S) | : Daxiong Ji | |

It is certified that error appears in the above-identified patent and that said Letters Patent is hereby corrected as shown below:

Title page item (12) DELETE "Daxion" and insert --Daxiong Ji--

On Title page at item "(76) Inventor", please DELETE "Ji Daxion" and, in lieu thereof, insert --Daxiong Ji--

Signed and Sealed this

Twenty-fourth Day of February, 2009

JOHN DOLL
*Acting Director of the United States Patent and Trademark Office*